United States Patent
Shuto et al.

(10) Patent No.: US 7,514,934 B2
(45) Date of Patent: Apr. 7, 2009

(54) DC BIAS VOLTAGE MEASUREMENT CIRCUIT AND PLASMA CVD APPARATUS COMPRISING THE SAME

(75) Inventors: Mitsutoshi Shuto, Tama (JP); Yasuaki Suzuki, Tama (JP)

(73) Assignee: ASM Japan K.K., Tokyo (JP)

( * ) Notice: Subject to any disclaimer, the term of this patent is extended or adjusted under 35 U.S.C. 154(b) by 735 days.

(21) Appl. No.: 11/232,532

(22) Filed: Sep. 22, 2005

(65) Prior Publication Data

US 2006/0063284 A1 Mar. 23, 2006

(30) Foreign Application Priority Data

Sep. 22, 2004 (JP) ............................. 2004-275769

(51) Int. Cl.
*G01R 31/12* (2006.01)
*H01H 9/50* (2006.01)

(52) U.S. Cl. .................................................... 324/536

(58) Field of Classification Search ................. 324/536
See application file for complete search history.

(56) References Cited

U.S. PATENT DOCUMENTS 4,602,981 A * 7/1986 Chen et al. .................... 438/17
6,440,260 B1 * 8/2002 Denda et al. ............. 156/345.1

* cited by examiner

*Primary Examiner*—Vincent Q Nguyen
*Assistant Examiner*—Amy He
(74) *Attorney, Agent, or Firm*—Knobbe, Martens, Olson & Bear LLP (57) ABSTRACT

A circuit for measuring DC bias voltage occurring in an ungrounded electrode of a plasma processing apparatus, includes: a first terminal connected between the ungrounded electrode and the RF power source; a second terminal for determining a value of the DC bias voltage; a first resistance connected between the first terminal and the second terminal; a second resistance connected between the second terminal and a ground; and a condenser disposed in parallel to the second resistance between the second terminal and the ground. The sum of the first resistance value and the second resistance value is about 50 MΩ or greater.

24 Claims, 5 Drawing Sheets

DC BIAS VOLTAGE MEASUREMENT CIRCUIT AND PLASMA CVD APPARATUS COMPRISING THE SAME

BACKGROUND OF THE INVENTION

1. Field of the Invention

The present invention generally relates to a semiconductor plasma CVD apparatus and more particularly to a circuit for measuring DC bias voltage of an ungrounded electrode.

2. Description of the Related Art

Conventionally, plasma CVD apparatuses for forming a thin film on a semiconductor substrate have been widely used. In these plasma CVD apparatuses, the susceptor side is used as one side of electrodes for plasma discharge by grounding it, and the showerhead side is used as the other side of the electrodes for plasma discharge by not grounding it. DC bias voltage (hereinafter referred to as "Vdc") occurs in an ungrounded electrode (e.g., a showerhead) to which radio-frequency power is applied. This Vdc value is normally measured by a Vdc measurement circuit incorporated in an RF matching circuit.

If an apparatus configuration or process conditions are identical, nearly the same Vdc value is indicated. Consequently, by confirming change in a Vdc value, a difference between apparatuses or apparatus abnormality can be known. Additionally, when a dielectric breakdown occurs in an oxide film on anode and the like coated on an electrode during plasma processing or when abnormal plasma discharge occurs, a Vdc value also fluctuates. Consequently, by monitoring a Vdc value during plasma processing and stopping the plasma processing when abnormal plasma discharge occurs, it becomes possible to prevent damage to a semiconductor substrate or a drop in throughput from occurring. Thus, Vdc value measurement plays an important role in the plasma processing. However, conventionally, the importance of a Vdc value has not been recognized in the art, and problems described below have not been recognized in the art.

Generally, a Vdc measurement circuit comprises several known resistances and a condenser and calculates a Vdc value from resistance values and voltage applied to the resistances.

SUMMARY OF THE INVENTION

However, a conventional Vdc measurement circuit has problems which have not been recognized in the art.

The first problem is that a voltage value detected by a conventional Vdc circuit (hereinafter referred to as "Vm") differs from an actual Vdc value. Between an electrode surface to which Vdc is applied and an entry point of the measurement circuit, an oxide film on anode coated on the electrode surface and a film generated by a reaction and adhering to a surface exist. Because those act as resistance, a potential difference is caused and a Vm becomes smaller than a Vdc. If the properties, a thickness or resistance of a film adhering to the electrode change with time, a Vm value changes with such a change. As a result, it produces a situation which it is impossible to distinguish between a Vm change resulted from an individual difference of an electrode and abnormality occurring in a process; to begin with, it is impossible to distinguish between actual occurrence and nonoccurrence of Vdc value change. Under such circumstances, it is impossible to achieve an object of monitoring plasma processing by providing a Vdc measurement circuit.

The second problem is that abnormal discharge such as a localized arc is partly caused by a conventional Vdc circuit. This was confirmed for the first time by an experiment conducted by the inventors of the present invention. Under specific conditions under which abnormal discharge frequently occurs, it was found that abnormal discharge stopped occurring as a result of disconnecting a conventional Vdc measurement circuit. From this experiment, it was confirmed that the conventional Vdc measurement circuit was one of the causes of abnormal discharge. When examining a reason for this, it is thought that a potential difference applied to an insulation film of an electrode becomes larger because input resistance supplied by a conventional measurement circuit is small (1 MΩ), thereby causing abnormal discharge such as an arc. By disconnecting a conventional Vdc measurement circuit, it is possible to avoid this problem, but if doing so, it becomes impossible to detect plasma stability or abnormality.

To solve one or more of the above-mentioned problems, in an embodiment, the present invention provides a circuit for measuring DC bias voltage occurring in an ungrounded electrode of a plasma processing apparatus, comprising: (i) a first terminal at which a voltage (Vm) corresponding to DC bias voltage occurs when the ungrounded electrode is charged with RF power from an RF power source, said first terminal being connected between the ungrounded electrode and the RF power source; (ii) a second terminal for determining a value of the DC bias voltage; (iii) a first resistance having a first resistance value by which the first terminal and the second terminal are connected; (iv) a second resistance having a second resistance value by which the second terminal and a ground are connected, wherein a sum of the first resistance value and the second resistance value is about 20 MΩ or greater; and (v) a condenser disposed in parallel to the second resistance between the second terminal and the ground. It is surprising that at least one of the above-mentioned problems can effectively be solved by increasing the input resistance value of a Vdc measurement circuit. In an embodiment, the Vdc measurement circuit includes the second terminal, the first resistance, and the second resistance, and the first terminal is not included in the Vdc measurement circuit. In that case, the circuit defined above includes the Vdc measurement circuit and the first terminal. However, the circuit may be referred to simply as the "Vdc measurement circuit".

The above embodiment includes, but is not limited to, the following embodiments:

The sum of the first resistance value and the second resistance value is preferably about 50 MΩ or greater. In other embodiments, the sum can be 30 MΩ, 40 MΩ, 100 MΩ, 200 MΩ, or any numbers therebetween. In another embodiment, the resistance can be infinitely large.

The second terminal outputs a measured value of DC bias voltage (Vm2). The circuit may further comprise: (vi) a switching terminal connected between the second terminal and the second resistance; (vii) a third resistance having a third resistance value, disposed in parallel to the second resistance between the second terminal and the ground, wherein a sum of the first resistance value and the third resistance value is about 10 MΩ or less; and (viii) a switch for switching between the second resistance and the third resistance to connect the second terminal. The switch may be capable of connecting neither the second nor third resistance to the second terminal wherein a resistance value is infinitely large.

In the above, without using the third resistance, the circuit may simply comprise a switching terminal connected between the second terminal and the second resistance, wherein the switch is capable of not connecting the second resistance to the second terminal wherein a resistance value is indefinite.

The ungrounded electrode may be a shower head.

In another aspect, the present invention provides a method for detecting abnormal discharge in the plasma processing apparatus, comprising: (a) providing any suitable circuit of the foregoing disposed between the ungrounded electrode and the RF power source, wherein the second terminal outputs a measured value of DC bias voltage (Vm2); (b) applying RF power from the RF power source to the ungrounded electrode; (c) monitoring Vm2 outputted from the second terminal; and (d) detecting abnormal electrical discharge in the plasma processing apparatus based on the monitored Vm2.

The above embodiment includes, but is not limited to, the following embodiments.

The method may further comprise, in the step of providing the circuit, increasing the sum of the first resistance value and the second resistance value to about 50 MΩ or greater.

Abnormal electric discharge is detected when Vm2 exceeds a predetermined value or a change of Vm2 per unit time exceeds a predetermined value.

In still another aspect, the present invention provides a method for detecting abnormal discharge in the plasma processing apparatus, comprising: (a) providing any suitable circuit of the foregoing disposed between the ungrounded electrode and the RF power source, wherein the sum of the first and second resistances is infinitely large; (b) applying RF power from the RF power source to the ungrounded electrode; (c) monitoring electro static field intensity at the second terminal; and (d) detecting abnormal electrical discharge in the plasma processing apparatus based on the monitored electro static filed intensity.

In yet another aspect, the present invention provides a method for detecting abnormal discharge in the plasma processing apparatus, comprising: (a) providing any suitable circuit of the foregoing disposed between the ungrounded electrode and the RF power source, wherein the second terminal outputs a measured value of DC bias voltage (Vm2); (b) using any suitable circuit of the foregoing, comprising: (a) applying RF power from the RF power source to the ungrounded electrode; (c) switching the switch not to connect the second terminal to the second resistance; (d) monitoring electro static field intensity at the second terminal; and (e) detecting abnormal discharge in the plasma processing apparatus based on the monitored electro static field intensity.

In still another aspect, the present invention provides a method for detecting deposition of a film on a surface of the ungrounded electrode, comprising: (a) providing any suitable circuit of the foregoing disposed between the ungrounded electrode and the RF power source, wherein the second terminal outputs a measured value of DC bias voltage (Vm2); (b) applying RF power from the RF power source to the ungrounded electrode to deposit a film on a substrate placed in the plasma processing apparatus; (c) measuring Vm2 outputted from the second terminal when connected to the second resistance when initiating applying RF power; (d) measuring Vm2-1 outputted from the second terminal when connected to the second resistance and Vm2-2 outputted from the second terminal when connected to the third resistance by switching using the switch, while the film deposition progresses; and (e) determining deposition of a film on the surface of the ungrounded electrode based on a difference between Vm2-1 and Vm2-2.

Each of the aforesaid methods may further comprise, in the step of providing the circuit, increasing the sum of the first resistance value and the second resistance value to about 50 MΩ or greater.

The present invention is also applicable to a plasma CVD apparatus for forming a thin film on a substrate, which comprises: (I) a reactor; (II) a grounded susceptor for placing the substrate thereon inside the reactor; (III) a ungrounded showerhead disposed facing the susceptor inside the reactor for supplying reaction gas to the substrate; (IV) an RF power source for applying radio-frequency power to the showerhead; and (V) any suitable circuit of the foregoing provided between the showerhead and the RF power source.

In all of the aforesaid embodiments, any element used in an embodiment can interchangeably and additionally be used in another embodiment unless such a replacement is not feasible or causes adverse effect.

In at least one embodiment of the present invention, by using the Vdc measurement circuit, an actual DC bias voltage value of a surface of an ungrounded electrode can be accurately determined and it becomes possible to confirm process stability or detect abnormality with high accuracy.

Additionally, in at least one embodiment of the present invention, by using the Vdc measurement circuit, the occurrence of abnormal discharge during plasma processing can be prevented.

Further, in at least one embodiment of the present invention, by using the Vdc measurement circuit, a resistance value of an insulation film coated on an ungrounded electrode can be measured easily.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

Preferred embodiments of the present invention are described with reference to drawings attached. However, the embodiments are not intended to limit the present invention.

Figure 1A:
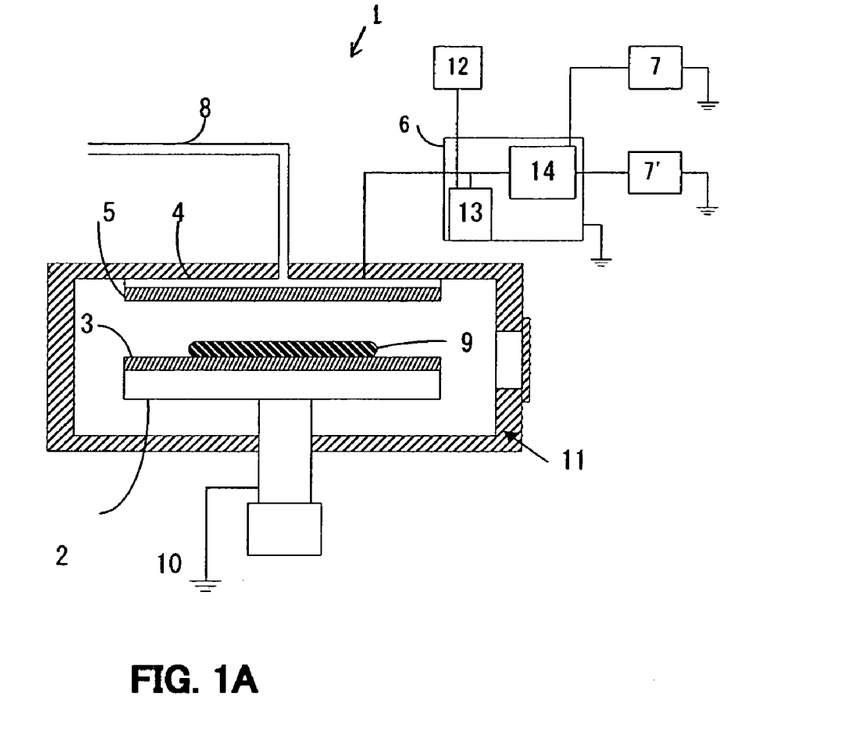
FIG. 1A is a schematic diagram showing a plasma CVD apparatus according to an embodiment of the present invention. The drawing is oversimplified for illustrative purposes.

FIG. 1A shows a parallel flat-plate type plasma CVD apparatus according to an embodiment of the present invention.

The drawing is oversimplified and is not scaled for illustrative purposes. The plasma CVD apparatus includes a reactor 11. Inside the reactor 11, a susceptor 3 for placing a semiconductor wafer 9 thereon is provided. The susceptor 3 is supported by a heating block 2 for heating the semiconductor wafer 9 at a given temperature. The heating block 2 is grounded 10 and forms one side of electrodes for plasma discharge. In the upper portion of the reactor 11, a showerhead 4 is provided parallel to and facing the susceptor 3. A reaction gas inlet pipe 8 is linked to the showerhead 4 through which reaction gas is introduced. The reaction gas is jetted out uniformly onto the semiconductor wafer 9 through a large number of fine pores (not shown) provided at the underside of the showerhead 4. The underside of the showerhead 4 is coated by an oxide film on anode 5. The showerhead 4 is connected with radio-frequency power sources (7, 7') via a matching box 6 and forms the other side of the electrodes for plasma discharge. An RF matching circuit 14 and a Vdc measurement circuit 13 are incorporated in the matching box 6.

Figure 2:
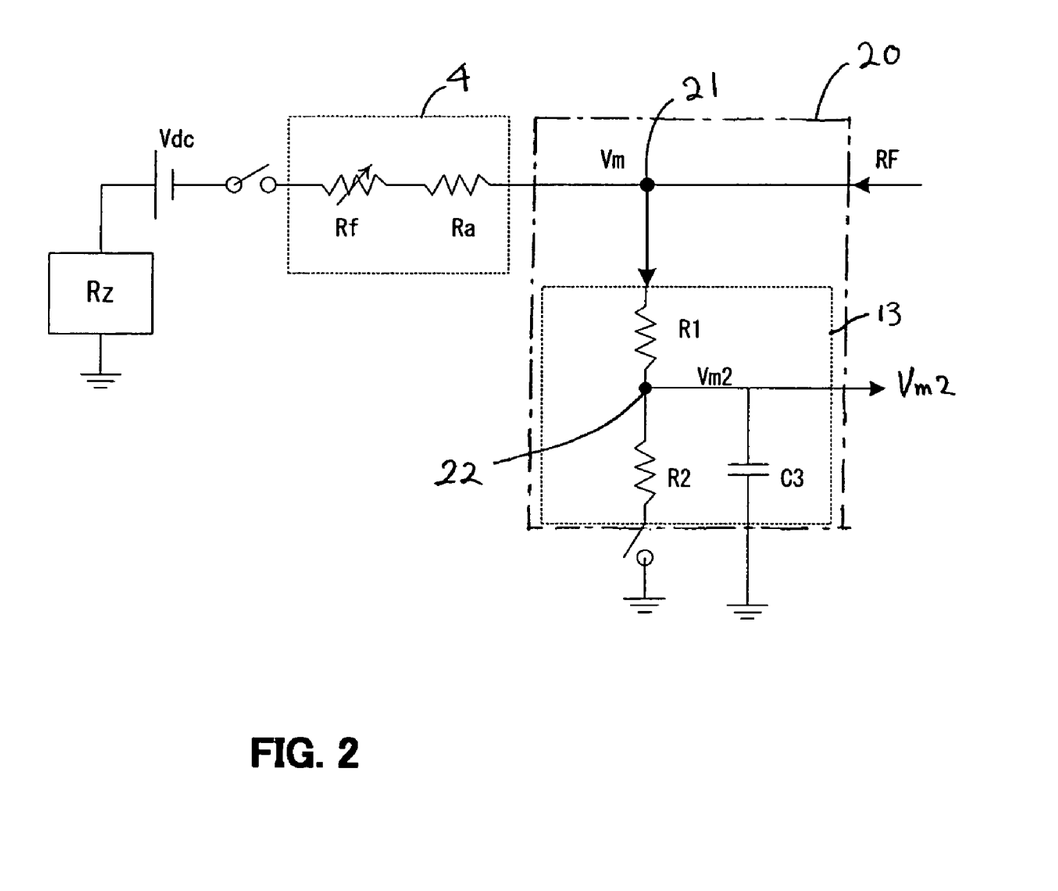
FIG. 2 shows an equivalent circuit from a showerhead to a Vdc measurement circuit according to an embodiment of the present invention.

A controller 12 is connected to the Vdc measurement circuit 13 (at a second terminal 22 in FIG. 2). The controller 12 monitors Vdc which is outputted as Vm2 (explained below) from the Vdc measurement circuit 13 to the controller 12. The controller 12 is configured to detect abnormal electric discharge when Vm2 exceeds a predetermined value or a change of Vm2 per unit time exceeds a predetermined value. When abnormal electric discharge is detected, the controller 12 outputs an interlock signal to a system controller (not shown) or a power unit (now shown) to abort the deposition process or stop the entire operation of the plasma CVD apparatus 1. The controller 12 can be separately installed or can be installed as a part of a controller for the entire apparatus or can be combined with the RF power matching circuit 14.

The interlock signal may be a signal which changes the current step programmed in a recipe to an abort step or may be a signal which shuts down power. The interlock signal may also include a signal which notifies an operator of abnormal operation.

For monitoring Vm2, the controller 12 includes a voltmeter. However, in a case where the input resistance of the Vdc measurement circuit 13 is infinitely large (e.g., in the case of FIG. 3 where R1 is connected to a terminal S3), the controller 12 includes an electro static field intensity meter for monitoring an electro static filed intensity outputted from the second terminal 22 in FIG. 2. When the input resistance is infinitely large, the electro static field intensity meter can measure an actual Vdc value. In that case, the controller 12 may be configured to detect abnormal electric discharge when Vdc exceeds a predetermined value or a change of Vdc per unit time exceeds a predetermined value.

Figure 1B:
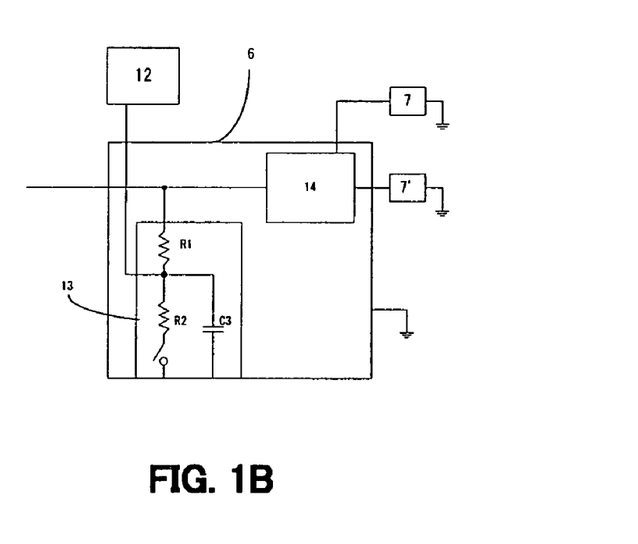
FIG. 1B is a schematic diagram showing a Vdc measurement circuit installed in a matching box according to an embodiment of the present invention.
Figure 1C:
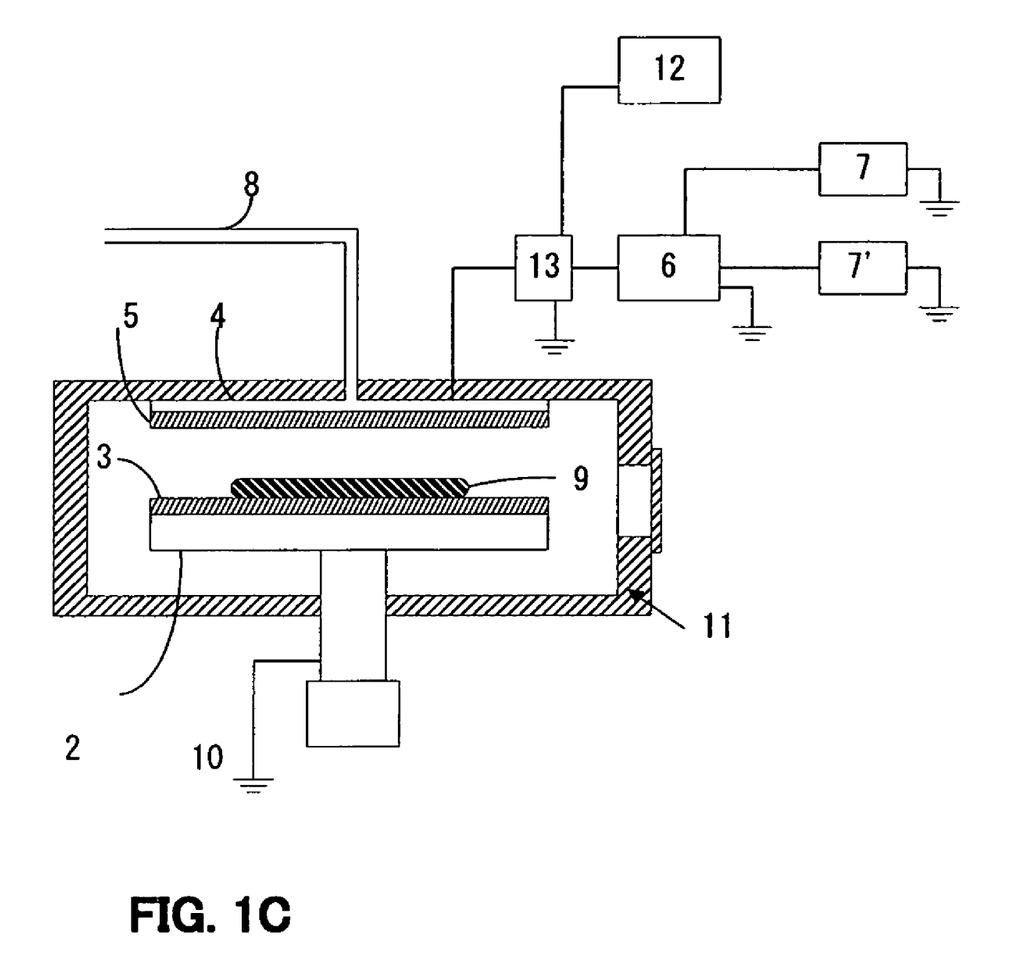
FIG. 1C is a schematic diagram showing a plasma CVD apparatus according to another embodiment of the present invention. The drawing is oversimplified for illustrative purposes.

FIG. 1C is a schematic diagram showing a plasma CVD apparatus according to another embodiment of the present invention. The drawing is oversimplified and is not scaled for illustrative purposes. In this figure as compared with FIG. 1A, the Vdc measurement circuit 13 is not incorporated in the matching box 6 but is connected between the matching box 6 and the showerhead 4.

In FIGS. 1A and C, the controller 12 can be omitted in an embodiment. In that case, Vm2 can be monitored manually, e.g., by an operator using a voltmeter. The controller 12 need not include an interlocking mechanism in an embodiment. In that case, an operator stops the reactor when abnormal electric discharge is detected.

FIG. 2 shows an equivalent circuit from the showerhead 4 to the Vdc measurement circuit according to an embodiment of the present invention. A circuit 20 according to this embodiment of the present invention includes components encircled with a broken line comprising a first terminal 21 and a Vdc measurement circuit 13 encircled with a dotted line including a first resistance R1 connected between the first terminal 21 and a second terminal 22, a second resistance R2 connected between the second terminal 22 and a ground, and a condenser C3 disposed in parallel to the resistance R2 and connected between the second terminal 22 and a ground (herein the circuit including the first terminal and the Vdc measurement circuit may be referred to simply as the "Vdc measurement circuit"). The first resistance R1 and the second resistance R2 constitute an input resistance connected in series. The condenser C3 is a bias condenser (having a capacity of, e.g., $10^3$-$10^5$ pF) for removing a radio-frequency component. Vm2 is outputted from the second terminal 22. Both are related as follows:

$$Vm=(R1+R2)/R2 \cdot Vm2$$

In the above, R1 and R2 (also R3 discussed later) denote resistances as components and also denotes voltage values.

As understood from the above equation, an inequity, Vm2<Vm, is satisfied so that a measured voltage can be reduced, thereby protecting a measurement circuit. A ratio of R1 to R2 can be selected depending on a desired reduction of Vm. For example, when R1/R2 is 9/1, Vm2/Vm is 1/10, and when R1/R2 is 99/1, Vm2/Vm is 1/100. If R1/R2 is 1/9, Vm2/Vm is 9/10 (R1/R2 is 1/9, Vm2/Vm is 99/100), and thus, there is no significance of using divided resistances.

More importantly, when the sum of R1 and R2 is large such as 50 MΩ or higher, process stability or abnormal discharge can be detected more accurately, regardless of the ratio of R1/R2, in an embodiment.

Vdc represents DC bias voltage appearing on the showerhead 4 which is an ungrounded electrode in this embodiment. As described above, a surface of the showerhead is coated by an oxide film on anode, a resistance of which is expressed by Ra. Additionally, a resistance of a film adhering to a surface of the showerhead is expressed by Rf. A resistance value of Rf changes as the properties and a thickness of a film adhering change. The showerhead 4 and the RF power source(s) are connected to the first terminal 21 of the Vdc measurement circuit 20.

Rz in the figure represents an impedance of the reactor 11. The ground corresponds to the ground 10 in FIG. 1A or 1C.

As described above, in the case of a conventional Vdc measurement circuit, an input resistance value (R1+R2) was not sufficiently large against the sum of a resistance value of a showerhead (Ra) and a resistance of a film adhering to a surface of the showerhead (Rf), and thus a large potential difference occurred in an insulation film of the showerhead, thereby making a Vm smaller than a Vdc (Vm<<Vdc). It was therefore difficult to measure an accurate Vdc.

The value of Ra may vary depending on the showerhead. For example, Ra may be 250 MΩ to 5 MΩ (Ra of the showerhead used in the examples described later was 250 MΩ). The value of Rf may vary depending on the type of film and also may vary with time. For example, in the examples described later, when initiating deposition, Rf was zero, and 60 seconds later, Rf increased to 450 Ω. Rf tends to continue increasing with time.

Additionally, it was confirmed by the inventers of the present invention that abnormal discharge was partly caused by this small input resistance value of the Vdc measurement circuit. Accordingly, the inventers of the present invention devised to overcome the above-mentioned shortcomings by making an input resistance value of the Vdc measurement circuit larger as compared with a resistance value of the insulation film. In other words, while an input resistance value of a conventional Vdc measurement circuit is approx. 1 MΩ, in an embodiment of the present invention, it is 50 MΩ or larger, preferably 100 MΩ or larger, which is sufficiently larger than a resistance value (Ra+Rf) of the showerhead. By making an input resistance value 50 MΩ or larger, a voltage applied to an insulation film of the showerhead and a current flowing in the circuit become smaller, thereby preventing abnormal discharge from occurring during plasma processing. Additionally, because an input resistance of the Vdc measurement circuit is sufficiently larger than the resistance sum (Ra+Rf) of the insulation film coated on the showerhead and a film adhering to the showerhead, a voltage at a circuit entry point becomes larger and hence it is possible to ignore a potential difference in the insulation film, thereby making a Vm nearly equal to a Vdc. As a result, it becomes possible to know an actual Vdc accurately. However, because an impedance of a circuit connected to Vm2 has an influence on Vm, it is preferable to make a resistance value of R1 larger than 100 times a resistance value of R2. In other embodiments, R1 may be simply greater than R2 or 5, 10, or 50 times greater than R2.

FIG. 1B is a schematic diagram showing an embodiment of the Vdc measurement circuit installed in the matching box shown in FIG. 1A.

Figure 3:
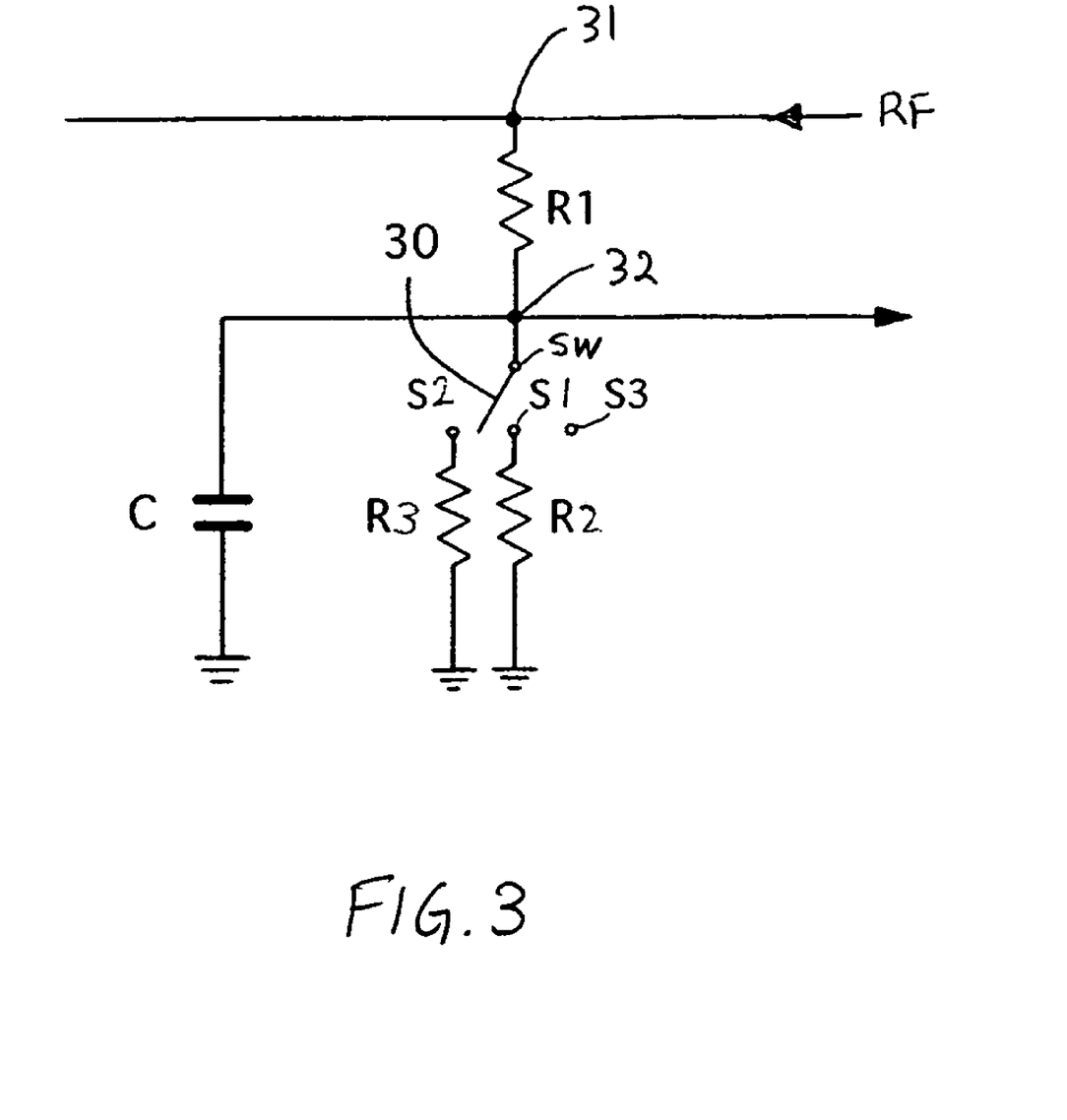
FIG. 3 shows a modified example of a Vdc measurement circuit according to another embodiment of the present invention.

FIG. 3 shows a modified example of the Vdc measurement circuit according to an embodiment of the present invention. A difference from the circuit shown in FIG. 2 is that a second resistance is switchable between R2 and R3 by a switch 30 provided at a terminal SW. As in FIG. 2, R1 is connected between a first terminal 31 and a second terminal 32. In one embodiment, respective resistance values of R1, R2 and R3 are 5 MΩ, 95 MΩ and 5 MΩ. When the switch 30 is switched over to a terminal S1, an input resistance value becomes 100 MΩ; when the switch 30 is switched over to a terminal S2, an input resistance value becomes 10 MΩ; when the switch 30 is switched over to a terminal S3, an input resistance value becomes infinitely large. Preferably, a resistance value of R3 is 5 MΩ or smaller. A resistance value of R2 may be any value if it is no less than 45 MΩ. By switching a resistance value of the second resistance, an input resistance value of the circuit is changed, and a Vm is changed. From this Vm value difference, resistance values of a resistance Ra of an insulation film coated on an electrode and of a resistance Rf of an adhering film can be calculated as follows:

$$Vdc = \frac{(Ra + Rf) + (R1 + R2)}{(R1 + R2)} Vms1$$

$$Vdc = \frac{(Ra + Rf) + (R1 + R3)}{(R1 + R3)} Vms2$$

In the above, Vms1 is Vm2 when R1 is connected to R2 using the terminal S1, and Vms2 is Vm2 when R1 is connected to R3 using the terminal S2. From the above two equations, the following equation is derived:

$$(Ra + Rf) = \frac{(R1 + R2) \times (R1 + R3) \times (Vms2 - Vms1)}{(R1 + R3) \times Vms1 - (R1 + R2) Vms2}$$

In the above, R1, R2, and R3 are known. Vms1 and Vms2 can be determined by measuring Vm2 outputted from the circuit (Vm2-1 and Vm2-2, respectively). Thus, (Ra+Rf) can be calculated. When deposition begins, Rf is zero (no deposition on a surface of the showerhead), and thus, Ra can be calculated. Also, Vdc can be calculated. Since, Ra is substantially constant, at any point of time after deposition begins, Rf can be calculated by determining Vms1 and Vms2.

When R1 is connected to the terminal S3, the resistance is considered to be infinitely large because no electrical connection is established at S3. In that case, by using an electro static field intensity meter, actual Vdc can be measured.

The number of switching terminals are not limited to three as shown in FIG. 3 but includes two or four or more.

EXAMPLES

An input resistance value of the Vdc measurement circuit and occurrence of abnormal discharge are described here in detail with reference to the following examples. The examples are not intended to limit the present invention.

In the Vdc measurement circuit shown in FIG. 2, an input resistance value means the sum of R1 and R2. An input resistance value used in a conventional Vdc measurement circuit was approx. 1 MΩ. Experiments on whether abnormal discharge occurs or not and how Vm is changed over time when an input resistance value is changed were conducted.

First, an actual Vdc was measured using an electrostatic field intensity meter. Because measurement using the electrostatic field intensity meter is contactless measurement, it is right to consider that a resistance value is infinitely large. Consequently, a measurement value indicates an actual Vdc value. At this time, abnormal discharge was not observed. Next, Vm change and whether abnormal discharge occurs or not when an input resistance value of the Vdc measurement circuit is changed from 5MΩ, 10 MΩ, 50 MΩ, to 100MΩ were measured. Experiment results are shown in Table 1.

TABLE 1

| Input Resistance Value (Ω) | Vm (V) | Occurrence of Abnormal Discharge |
| --- | --- | --- |
| 1 M | −48.4 | Occurred |
| 5 M | −72.0 | Occurred |
| 10 M | −76.3 | Occurred |
| 50 M | −80.0 | No occurrence |
| 100 M | −80.5 | No occurrence |
| ∞ | −81* | No occurrence |

*An actual Vdc measured using an electrostatic field intensity meter

As seen from Table 1, when an input resistance value was 1 MΩ, 5 MΩ and 10 MΩrespectively, a large difference occurred between a measured voltage Vm and an actual Vdc and abnormal discharge also occurred frequently. When an input resistance value was 50 MΩ and 100 MΩ respectively, there was almost no difference between a measured voltage Vm and an actual Vdc and abnormal discharge did not occur at all. From this, it is seen that if an input resistance value is 50 MΩ or larger, a Vm is nearly equal to Vdc and abnormal discharge does not occur.

Figure 4:
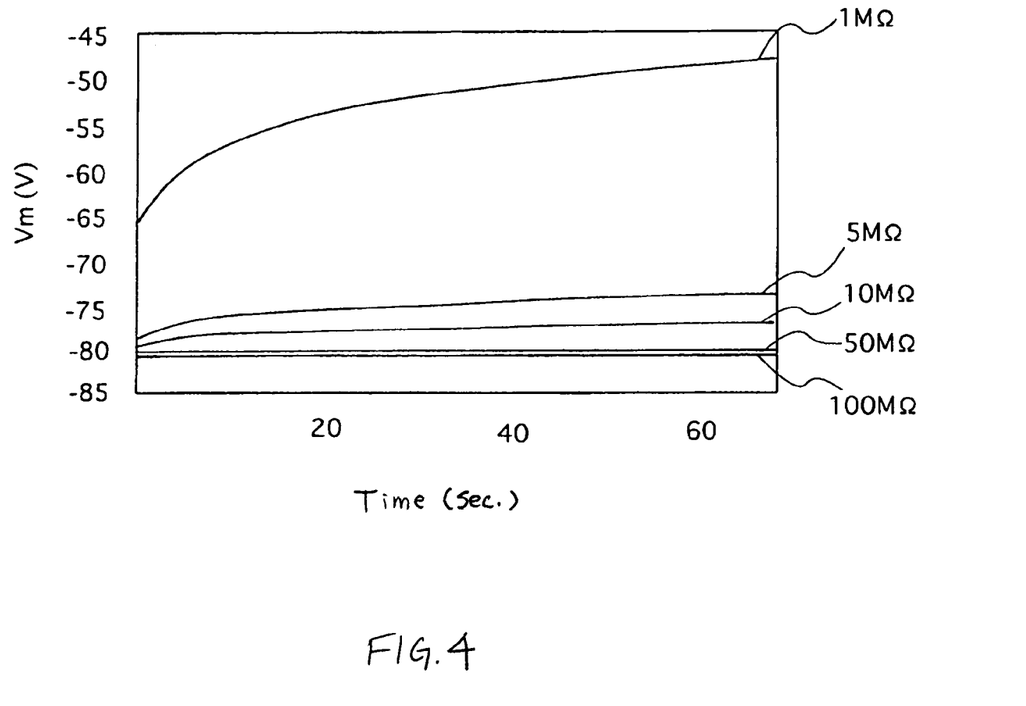
FIG. 4 is a graph showing how a Vm value was changed with time for each input resistance value.

An experiment of observing Vm change over time for each input resistance value when an input resistance value is changed was conducted. FIG. 4 is a graph showing how a Vm value was changed with time for each input resistance value. From the graph, it is seen that a Vm value was significantly changed with time when an input resistance value was 1 MΩ. It is thought that this was affected by change in a thickness of a film adhering to an electrode surface. When an input resistance value was 5 MΩ and 10 MΩ respectively as well, it is seen that a Vm value was changed with time even though the change was small. Meanwhile, when an input resistance value was 50 MΩ and 100 MΩ respectively, a Vm value was not changed at all and was stable. From this, it is seen that if an input resistance value is 50 MΩ or larger, a Vm value is nearly equal to a Vdc value and is stable.

Embodiments of the plasma CVD apparatus according to the present invention were explained above, but the present invention can apply to a plasma processing apparatus other than plasma CVD apparatuses.

The present invention includes the above mentioned embodiments and other various embodiments including the following:

A circuit for measuring DC bias voltage occurring in an ungrounded electrode of a plasma processing apparatus, which comprises a first terminal, a second terminal, a first resistance connected between the first terminal and the second terminal, a second resistance connected between the second terminal and ground, and a condenser connected in parallel with second resistance between the second terminal and the ground, wherein an RF power source and the ungrounded electrode are connected with the first terminal and a measured value of the DC bias voltage is outputted from the second terminal; which is characterized in that an input resistance value which is the sum of resistance values of the first resistance and the second resistance is at least 50 MΩ.

A circuit for measuring DC bias voltage occurring in an ungrounded electrode of a plasma processing apparatus, which comprises a first terminal, a second terminal, a third terminal, a fourth terminal, a first resistance connected between the first terminal and the second terminal, a condenser connected between the second terminal and ground, a second resistance connected between the third terminal and ground, a third resistance connected the fourth terminal and ground, and a switching means provided between the second terminal and the third terminal, and the fourth terminal for switching connection between the first resistance and the second resistance or the third resistance, wherein an RF power source and the ungrounded electrode are connected with the first terminal and a measured value of the DC bias voltage is outputted from the second terminal; which is characterized in that a first input resistance value which is the sum of resistance values of the first resistance and the second resistance is at least 50 MΩ and a second input resistance value which is the sum of resistance values of the first resistance and the third resistance is 10 MΩ or less.

A plasma CVD apparatus for forming a thin film on a semiconductor substrate comprising a reactor, a susceptor for placing the semiconductor substrate thereon inside the reactor, which is grounded, a showerhead disposed facing the susceptor inside the reactor for supplying reaction gas to the semiconductor substrate, which is ungrounded, an RF power source for applying RF power to the showerhead, and the circuit of any of the foregoing provided between the showerhead and the RF power source.

The plasma CVD apparatus further comprising a deciding means for deciding occurrence of abnormal electric discharge inside the reactor based on a DC bias voltage measured value obtained from the circuit, and an interlocking means for stopping processing in response to a signal received from the deciding mean.

The present application claims priority to Japanese Patent Application No. 2004-275769, filed Sep. 22, 2004, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A circuit for measuring DC bias voltage occurring in an ungrounded electrode of a plasma processing apparatus, comprising:

a first terminal at which a voltage (Vm) corresponding to DC bias voltage occurs when the ungrounded electrode is charged with RF power from an RF power source, said first terminal being connected between the ungrounded electrode and the RF power source;

a second terminal for determining a value of the DC bias voltage;

a first resistance having a first resistance value by which the first terminal and the second terminal are connected;

a second resistance having a second resistance value by which the second terminal and a ground are connected, wherein a sum of the first resistance value and the second resistance value is about 20 MΩ or greater; and a condenser disposed in parallel to the second resistance between the second terminal and the ground.

2. The circuit according to claim 1, wherein the second terminal outputs a measured value of DC bias voltage (Vm2).

3. The circuit according to claim 2, further comprising:

a switching terminal connected between the second terminal and the second resistance;

a third resistance having a third resistance value, disposed in parallel to the second resistance between the second terminal and the ground, wherein a sum of the first resistance value and the third resistance value is about 10 MΩ or less; and a switch for switching between the second resistance and the third resistance to connect the second terminal.

4. The circuit according to claim 3, wherein the switch is capable of connecting neither the second nor third resistance to the second terminal wherein a resistance value is infinitely large.

5. The circuit according to claim 2, further comprising a switching terminal connected between the second terminal and the second resistance, wherein the switch is capable of not connecting the second resistance to the second terminal wherein a resistance value is indefinite.

6. The circuit according to claim 1, wherein the sum of the first resistance value and the second resistance value is about 50 MΩ or greater.

7. The circuit according to claim 1, wherein the ungrounded electrode is a shower head.

8. A method for detecting abnormal discharge in the plasma processing apparatus, comprising:

providing the circuit of claim 1 disposed between the ungrounded electrode and the RF power source, wherein the second terminal outputs a measured value of DC bias voltage (Vm2);

applying RF power from the RF power source to the ungrounded electrode;

monitoring Vm2 outputted from the second terminal; and detecting abnormal electrical discharge in the plasma processing apparatus based on the monitored Vm2.

9. The method according to claim 8, further comprising, in the step of providing the circuit, increasing the sum of the first resistance value and the second resistance value to about 50 MΩ or greater.

10. The method according to claim 8, wherein abnormal electric discharge is detected when Vm2 exceeds a predetermined value or a change of Vm2 per unit time exceeds a predetermined value.

11. A method for detecting abnormal discharge in the plasma processing apparatus, comprising:

providing the circuit of claim 1 disposed between the ungrounded electrode and the RF power source, wherein the sum of the first and second resistances is infinitely large;

applying RF power from the RF power source to the ungrounded electrode;

monitoring electro static field intensity at the second terminal; and detecting abnormal electrical discharge in the plasma processing apparatus based on the monitored electro static field intensity.

12. The method according to claim 11, further comprising increasing the sum of the first resistance value and the second resistance value to about 50 MΩ or greater.

13. A method for detecting abnormal discharge in the plasma processing apparatus, comprising:

providing the circuit of claim 5 disposed between the ungrounded electrode and the RF power source, wherein the second terminal outputs a measured value of DC bias voltage (Vm2);

applying RF power from the RF power source to the ungrounded electrode;

switching the switch not to connect the second terminal to the second resistance;

monitoring electro static field intensity at the second terminal; and detecting abnormal discharge in the plasma processing apparatus based on the monitored electro static field intensity.

14. The method according to claim 13, further comprising, in the step of providing the circuit, increasing the sum of the first resistance value and the second resistance value to about 50 MΩ or greater.

15. A method for detecting deposition of a film on a surface of the ungrounded electrode, comprising:

providing the circuit of claim 3 disposed between the ungrounded electrode and the RF power source, wherein the second terminal outputs a measured value of DC bias voltage (Vm2);

applying RF power from the RF power source to the ungrounded electrode to deposit a film on a substrate placed in the plasma processing apparatus;

measuring Vm2 outputted from the second terminal when connected to the second resistance when initiating applying RF power;

measuring Vm2-1 outputted from the second terminal when connected to the second resistance and Vm2-2 outputted from the second terminal when connected to the third resistance by switching using the switch, while the film deposition progresses; and determining deposition of a film on the surface of the ungrounded electrode based on a difference between Vm2-1 and Vm2-2.

16. The method according to claim 15, further comprising, in the step of providing the circuit, increasing the sum of the first resistance value and the second resistance value to about 50 MΩ or greater.

17. A plasma CVD apparatus for forming a thin film on a substrate, comprising:

a reactor;

a grounded susceptor for placing the substrate thereon inside the reactor;

a ungrounded showerhead disposed facing the susceptor inside the reactor for supplying reaction gas to the substrate;

an RF power source for applying radio-frequency power to the showerhead; and the circuit of claim 1 provided between the showerhead and the RF power source.

18. The apparatus according to claim 17, wherein the sum of the first resistance value and the second resistance value is about 50 MΩ or greater.

19. The apparatus according to claim 17, further comprising a matching box for matching RF power disposed between the RF power sourced and the showerhead, wherein the circuit is incorporated inside the matching box along with an RF matching circuit.

20. The apparatus according to claim 17, wherein the second terminal outputs a measured value of DC bias voltage (Vm2), said apparatus further comprising a controller for monitoring Vm2 and deciding occurrence of abnormal electric discharge inside the reactor based on Vm2.

21. The apparatus according to claim 20, further comprising an interlocking system for stopping processing in response to a signal received from the controller.

22. The apparatus according to claim 17, wherein the circuit further comprising:

a switching terminal disposed between the second terminal and the second resistance;

a third resistance having a third resistance value, disposed in parallel to the second resistance between the second terminal and the ground, wherein a sum of the first resistance value and the third resistance value is 10 MΩ or less; and a switch for switching between the second resistance and the third resistance to connect the second terminal.

23. The apparatus according to claim 22, wherein the switch is capable of connecting neither the second nor third resistance to the second terminal wherein a resistance value is indefinite.

24. The apparatus according to claim 17, wherein the circuit further comprises a switching terminal disposed between the second terminal and the second resistance, wherein the switch is capable of not connecting the second resistance to the second terminal wherein a resistance value is indefinite.

* * * * *

UNITED STATES PATENT AND TRADEMARK OFFICE
CERTIFICATE OF CORRECTION

PATENT NO. : 7,514,934 B2  Page 1 of 1
APPLICATION NO. : 11/232532
DATED : April 7, 2009
INVENTOR(S) : Shuto et al.

It is certified that error appears in the above-identified patent and that said Letters Patent is hereby corrected as shown below:

In column 1, under the title, please insert the following:

-- <u>Related Application</u>

The present application claims priority to Japanese patent application No. 2004-275769 filed on September 22, 2004. --

In column 3, line 24, please change "filed" to -- field --

In column 5, line 44, please change "filed" to -- field --

In column 8, line 44, please change "MΩrespectively," to -- MΩ respectively --

Signed and Sealed this

Eighth Day of September, 2009

David J. Kappos
*Director of the United States Patent and Trademark Office*